(12) United States Patent
Stroud et al.

(10) Patent No.: US 10,488,456 B2
(45) Date of Patent: Nov. 26, 2019

(54) TEST INTERFACE WITH ACCESS ACROSS ISOLATION BARRIER

(71) Applicant: Silicon Laboratories Inc., Austin, TX (US)

(72) Inventors: Ernest T. Stroud, Austin, TX (US); Stefan N. Mastovich, Round Rock, TX (US); Huanhui Zhan, Austin, TX (US); Tamás Marozsák, Budapest (HU); András V. Horváth, Budapest (HU)

(73) Assignee: Silicon Laboratories Inc., Austin, TX (US)

( * ) Notice: Subject to any disclaimer, the term of this patent is extended or adjusted under 35 U.S.C. 154(b) by 206 days.

(21) Appl. No.: 15/609,996

(22) Filed: May 31, 2017

(65) Prior Publication Data

US 2018/0348295 A1    Dec. 6, 2018

(51) Int. Cl.
*G01R 31/28* (2006.01)
(52) U.S. Cl.
CPC ..... *G01R 31/2806* (2013.01); *G01R 31/2803* (2013.01)
(58) Field of Classification Search
CPC .......... H01L 2224/73265; H01L 24/48; H01L 24/45; G01R 31/31905; G01R 31/002; G01R 31/2886; G01R 31/31716; G01R 31/31717; G01R 31/3177; G01R 31/318513; G01R 31/31926; G01R 31/2806; G01R 31/2803; G01R 31/2853; G01R 31/28; G06F 13/4247; G06F 11/221; G06F 11/27; G06F 13/4045; G06F 13/4282; H04L 12/40052; H04L 25/0266; G02B 6/43; G02B 6/4246
See application file for complete search history.

(56) References Cited

U.S. PATENT DOCUMENTS

| | | | |
|---|---|---|---|
| 7,562,275 B2 * | 7/2009 | Juhn | G01R 31/31701 326/60 |
| 8,502,584 B1 | 8/2013 | Dong et al. | |
| 9,118,392 B2 | 8/2015 | Sundar et al. | |
| 9,143,373 B2 | 9/2015 | Sonntag et al. | |
| 9,257,836 B2 | 2/2016 | Mills et al. | |
| 9,531,253 B2 | 12/2016 | Wahby et al. | |
| 9,531,376 B2 | 12/2016 | Sonntag et al. | |
| 9,923,643 B2 | 3/2018 | Dupuis et al. | |
| 2009/0213914 A1 * | 8/2009 | Dong | H01L 23/48 375/219 |
| 2018/0076909 A1 * | 3/2018 | Latham | H01L 25/0655 |

* cited by examiner

*Primary Examiner* — Rahel Guarino
(74) *Attorney, Agent, or Firm* — Zaborin Cave LLP (57) ABSTRACT

An isolation system includes a transmit die and a receive die coupled by an isolation channel. The transmit die receives diagnostic data at an input terminal and transmits the diagnostic data over an isolation channel to a receive die. The receive die supplies a signal from an internal node in the receive die identified by the diagnostic data to an output terminal of the receive die. Other diagnostic data received by the transmit die causes the transmit die to supply a signal from an internal node in the transmit die to a terminal of the transmit die.

18 Claims, 9 Drawing Sheets

TEST INTERFACE WITH ACCESS ACROSS ISOLATION BARRIER

BACKGROUND

Field of the Invention

This invention relates to integrated circuits and more particularly to test and debug access to integrated circuits coupled by an isolation channel.

Description of the Related Art

Isolation products typically include a transmit die and one or more receive dies separated by an isolation channel in a single integrated circuit package. Such packages tend to be pin limited, limiting visibility, particularly into the receive die. That makes testing, debugging, and/or analyzing failures in parts difficult without decapping the parts to provide access to nodes not available when the die are in the package. Even with parts decapped, visibility into internal nodes is still limited.

Accordingly, improvements in testing, debugging, and/or analyzing failures is desirable.

SUMMARY OF EMBODIMENTS OF THE INVENTION

In one embodiment, a method includes receiving first diagnostic data at a transmit die and transmitting the first diagnostic data over an isolation channel to a receive die. The receive die receives the first diagnostic data and supplies a signal from an internal node in the receive die to an output terminal of the receive die. The first diagnostic data identifies the internal node in the receive die supplying the signal.

In another embodiment, a transmit die is coupled to an isolation channel and configured to transmit first diagnostic data over an isolation channel to a receive die. Receive logic in the receive die is coupled to the isolation channel and configured to select an internal node in the receive die based on the first diagnostic data. An output terminal on the receive die is coupled to receive a signal from the internal node. The signal indicates a state, e.g., voltage, of the internal node.

In another embodiment, an apparatus includes an isolation channel. A transmit die has an input terminal to receive first diagnostic data and is configured to transmit the first diagnostic data over the isolation channel after having diagnostic capability unlocked by having one or more unlock codes being written to the transmit die while a transmit die voltage supply is below a transmit die first voltage level. A receive die is coupled to receive the first diagnostic data over the isolation channel, the first diagnostic data including one or more unlock codes being written to one or more addresses in the receive die to enable diagnostic capability in the receive die if the one or more unlock codes are supplied while a receive die voltage supply is below a receive die first voltage level. The receive die is responsive to second diagnostic data received after the receive diagnostic capability is enabled to select an internal node. The receive die is responsive to the second diagnostic data to couple the internal node to an output terminal of the receive die if the diagnostic capability in the receive die has been unlocked.

BRIEF DESCRIPTION OF THE DRAWINGS

The present invention may be better understood, and its numerous objects, features, and advantages made apparent to those skilled in the art by referencing the accompanying drawings.

The use of the same reference symbols in different drawings indicates similar or identical items.

DETAILED DESCRIPTION

Figure 1A:
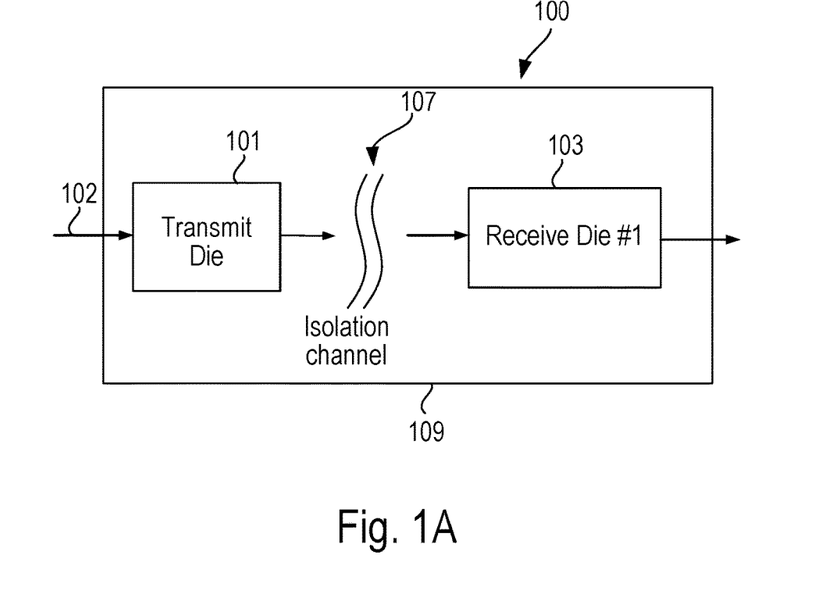
FIG. 1A illustrates a high level block diagram of an isolation system.

FIG. 1A illustrates an isolation system 100 that may incorporate embodiments of the invention. The isolation system includes a transmit die 101 separated from receive die 103 by an isolation channel 107. The dies and isolation channel are disposed in a package 109. While FIG. 1A shows only one transmit and receive die, other embodiments may have a different number of transmit and receive dies as required by the particular application where the system is being used. For example, there may be two receive dies separated from the transmit die by separate isolation channels. The isolation channel allows communication across an isolation barrier that provides electrical isolation between two voltage domains. Such isolation may be needed because during normal operation a large DC or transient voltage difference exists between the domains. Isolation barriers typically have layers of dielectrics with good breakdown properties. Communication across the isolation barrier may be accomplished using optical (opto-isolators), inductive (transformer) solutions, or using capacitive isolation circuitry.

Figure 1B:
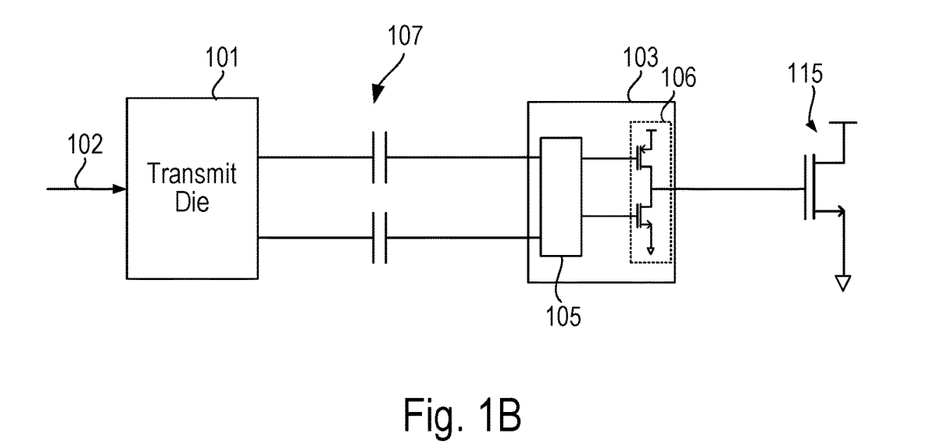
FIG. 1B functionally illustrates an isolation system.

FIG. 1B functionally illustrates an embodiment of the system 100. The transmit die 101 receives information on input 102 and transmits information over the capacitive isolation channel 107 to receive die 103. The receive die receives the transmitted information in logic 105, which drives output driver 106. The output of receive die 103 drives an external field effect transistor (FET) 115.

Rather than decap and probe the transmit and receive dies, the system 100, when utilizing embodiments of the diagnostic architecture described herein, can probe internal nodes on both the transmit and receive die and provide the probe values to package terminals. Thus, embodiments allow probing of internal nodes of analog (or digital) blocks of packaged isolation parts without decapping and probing.

Figure 2:
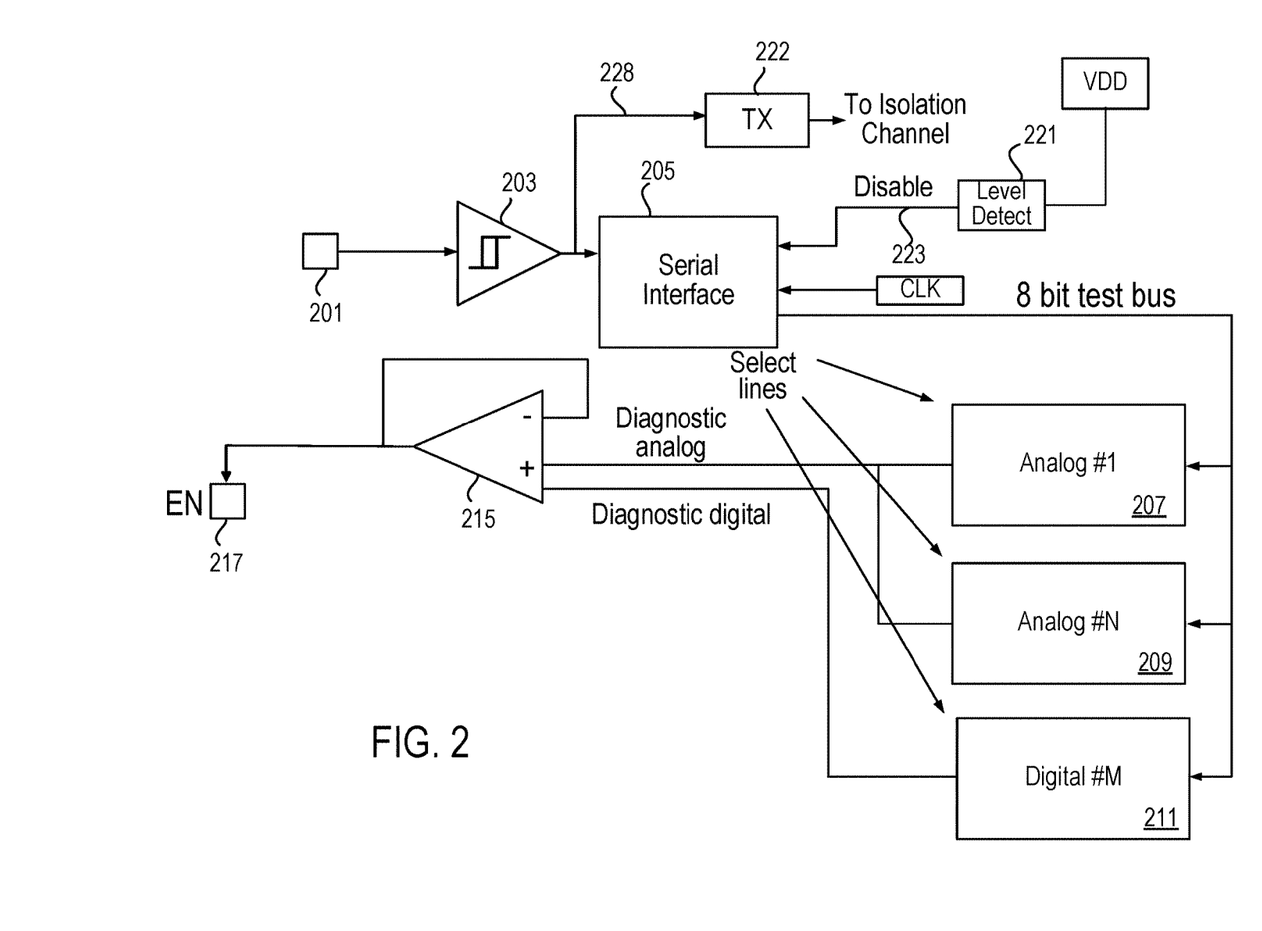
FIG. 2 illustrates an embodiment of the diagnostic structure of a transmit die.

FIG. 2 illustrates an embodiment of the diagnostic structure of transmit die 101 according to an embodiment. The transmit die includes an input 201 coupled to a Schmitt trigger device 203. Thus, a single input terminal is used for the test interface. In a diagnostic mode, the transmit die 101 receives diagnostic serial data that is supplied to serial interface 205. Pulse width of the signal supplied to the serial interface may be used to distinguish 1s and 0s. The die is normally not in a diagnostic mode of operation. The mechanism for enabling the diagnostic mode is described further herein. In an embodiment the diagnostic serial data includes address information identifying a particular location in the transmit die to access. For example, the address information identifies a particular one of the blocks 207, 209, and 211. In addition, the address information identifies a particular node within the particular block 207, 209, and 211. As shown in FIG. 2, the blocks may include analog blocks 207 and 209. While two analog blocks are shown, the number of analog blocks can vary in different embodiments based on such factors as the number of nodes needed to be visible and the size of the address information. Once a particular node is selected within a block, high input impedance buffer 215 receives the voltage value on the selected node and supplies the voltage signal to an output pad (also referred to herein as terminal) 217, which is coupled to a terminal on the package. In an embodiment, the analog voltage signal supplied varies between approximately 0 V and 2 V. In an embodiment, the output pad 217 also functions as an input enable (EN) terminal operationally. In other embodiments, the voltage from the probed node is supplied to a different input or output pad depending on availability. While the address may identify a node in one of the analog blocks 207 and 209, the address information may instead specify a digital node in digital block 211. Like the number of analog blocks, the number of digital blocks depends on such factors as the number of nodes for which visibility is desired and the size of the serial address information. Thus, the diagnostic architecture of the transmit die allows serial data to be received and an internal node to be supplied at an output terminal of the packaged dies. That allows testing and evaluation without decapping the part to probe nodes. In addition, internal nodes are visible that would not be available even if the part were decapped. The transmit die also supplies diagnostic data to the receive die via transmit interface 222.

Figure 3:
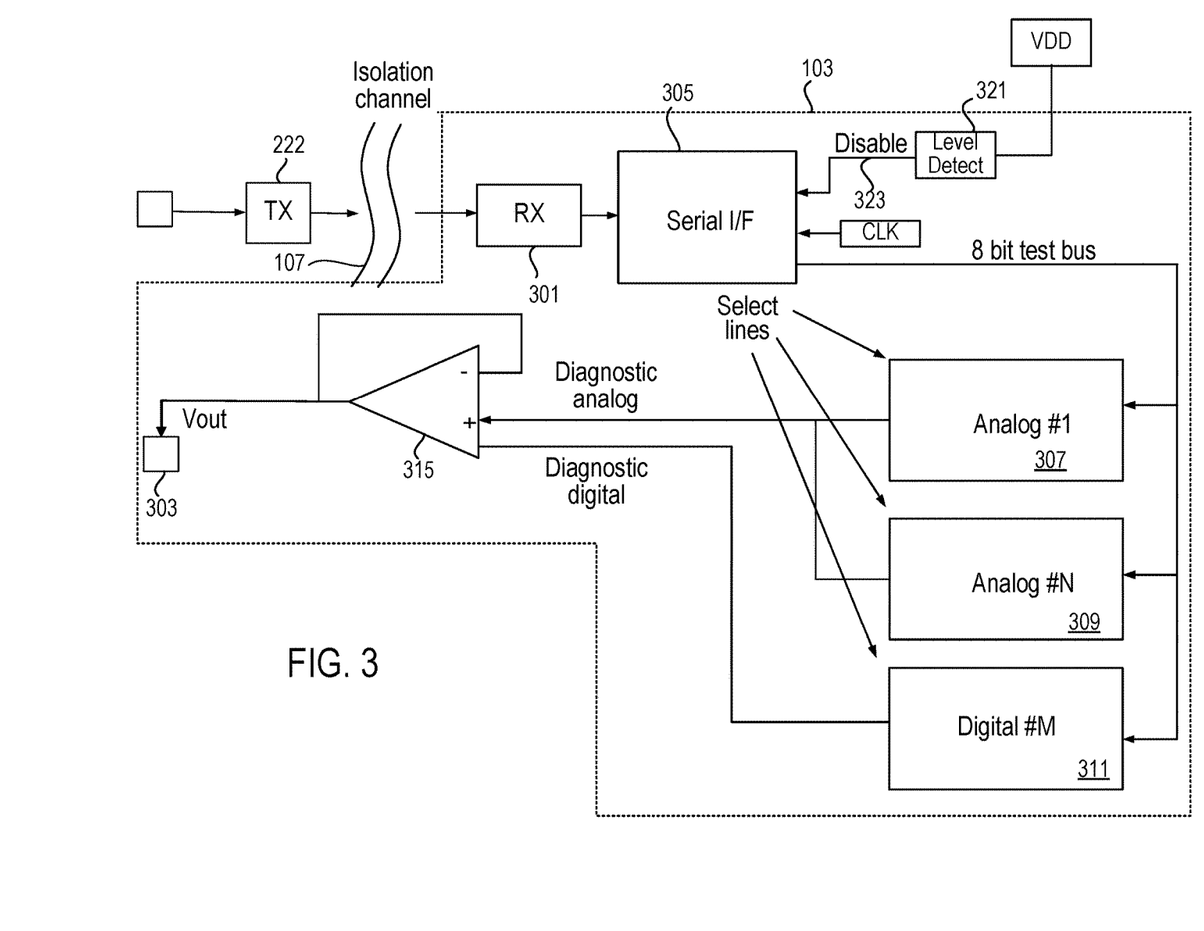
FIG. 3 illustrates an embodiment of the diagnostic structure of a receive die.

FIG. 3 illustrates an embodiment of the diagnostic structure of the receive die 103 according to an embodiment. The receive die has only three terminals available at the package: VDD, ground, and an output terminal. That limits the diagnostic capability even if the part were decapped. The receive die receives data from the isolation channel 107 at a receive interface 301. The functioning of a receive interface coupled to an isolation channel is well known in the art, depends on the particular isolation approach being used (e.g., capacitive, inductive, optical, etc.) and will not be described further. Functionally, the receive interface 301 receives a signal from the isolation channel and supplies an output signal to an output pad 303, which is coupled to a package terminal. The serial interface 305 plays no part in the functional operation of the receive die 103.

During diagnostic mode, the serial interface 305 receives serial diagnostic data from the isolation channel 107. Additional details on how the receive die enters the diagnostic mode is provided herein. The serial diagnostic data includes address information identifying a particular location in the receive die to access. For example, the address information identifies a particular one of the blocks 307, 309, and 311. The address information may instead identify another location in the die as described further herein. In addition, the address information identifies a particular node within the particular block 307, 309, and 311. As shown in FIG. 3, the blocks may include analog blocks 307 and 309. While two analog blocks are shown, the number of analog blocks can vary in different embodiments based on such factors as the number of nodes needed to be visible and the size of the address information. Once a particular node is selected within a selected block, buffer 315 receives the voltage value on the selected node and supplies the voltage signal to the output pad 303. While the address may identify a node in one of the analog blocks 307 and 309, the address information may instead specify a digital node in a digital block 311. Like the number of analog blocks, the number of digital blocks M depends on such factors as the number of nodes for which visibility is desired and the size of the serial address information.

Thus, the diagnostic architecture of the receive die allows serial diagnostic data to be received over the isolation channel identifying a node to "probe" and the receive die supplies the internal node at an output terminal of the receive die.

Figure 4:
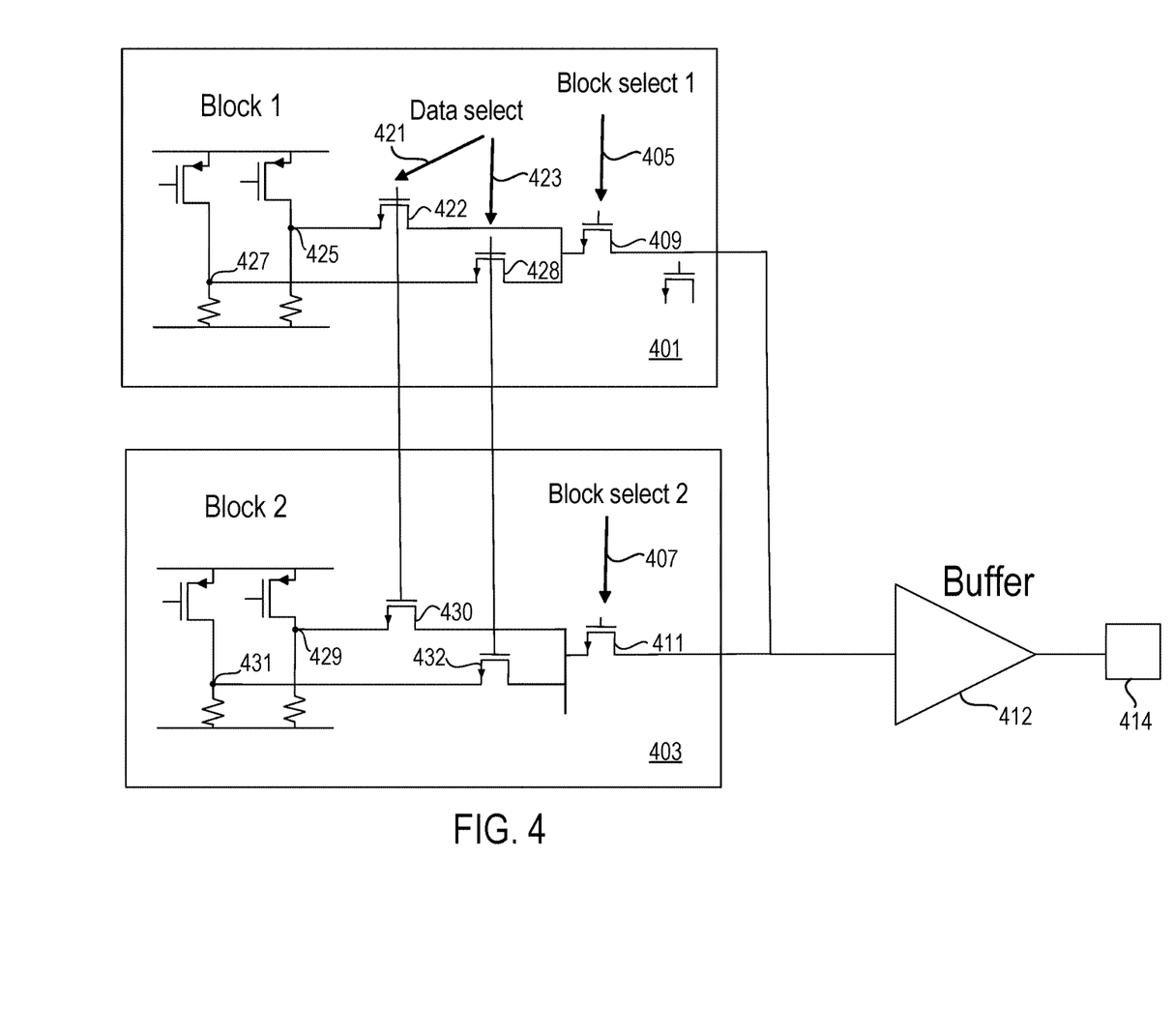
FIG. 4 illustrates an embodiment for selecting analog probe points.

FIG. 4 illustrates an embodiment for selecting analog probe points by selecting analog blocks and analog nodes within the blocks using the address information and data information. The implementation shown in FIG. 4 may be utilized in both the transmit die and the receive die. The analog nodes are those nodes that have an analog signal such as an analog voltage ranging, e.g., between approximately 0 V and 2 V. The selection of the analog nodes is to provide visibility to vital biasing and debugging nodes. FIG. 4 shows two analog blocks 401 and 403. The number of blocks shown in FIG. 4 is exemplary for ease of illustration and other embodiments may have a different number of blocks. In an embodiment, the address information includes block select information that may be decoded as block select signals. As shown in FIG. 4 block select signals 405 and 407 control the gates of transistors 409 and 411. Each block select signal is supplied to only one analog block and only one of the block select signals is active at a time. High input impedance buffer 412 receives the outputs of the block select transistors and drives the output pad 414. Tester apparatus may then process the information for use in testing and/or debugging the isolation system. The address information also provides the data select signals 421 and 423 to select particular nodes within the analog blocks. The data select signal 421 selects node 425 in block 1 by turning on probe switch (transistor) 422 and selects node 429 in block 2 by turning on probe switch 430. The data select signal 423 selects node 427 in block 1 by turning on probe switch 428 and selects node 431 in block 2 by turning on probe switch 432.

Figure 5:
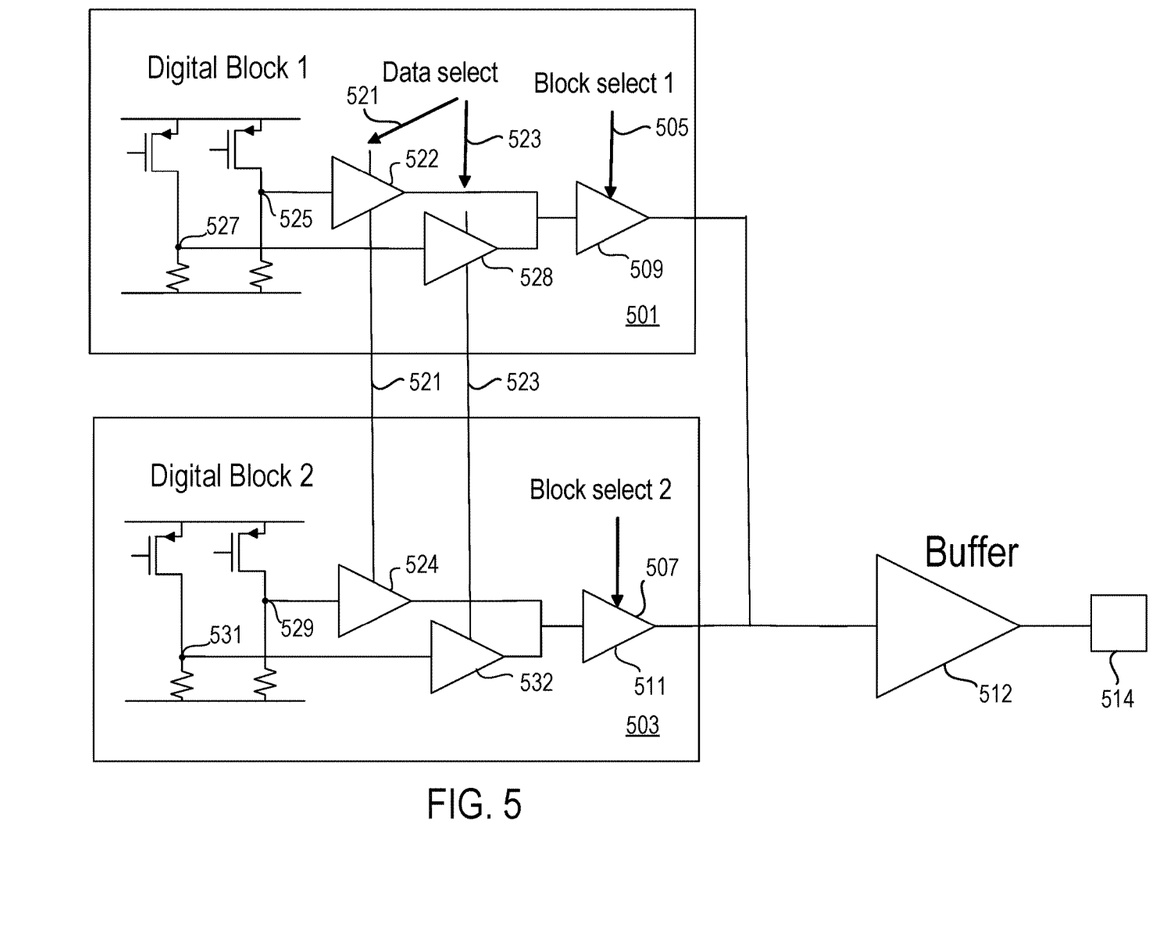
FIG. 5 illustrates an embodiment for selecting digital probe points.

FIG. 5 illustrates an embodiment for selecting digital probe points by selecting digital blocks and digital nodes within the blocks using the address information. The implementation shown in FIG. 5 may be utilized in the transmit die and the receive die. The digital nodes are those nodes that have a digital signal of interest on them. The digital signal may be, e.g., a clock signal or a high or low logic level. FIG. 5 shows two digital blocks 501 and 503. That number of blocks is exemplary and other numbers of blocks may be used. In an embodiment, the address information includes block select information that may be decoded as block select signals. As shown in FIG. 5 block select signals 505 and 507 respectively control the tristate buffers 509 and 511. Each block select signal is supplied to only one digital logic block and only one of the block select signals is active at a time. The outputs of the block select tristate buffers are supplied to buffer 512. Buffer 512 drives output pad 514. Note that output pads 514 and 414 (FIG. 4) are typically the same node. Note also that buffer 512 and buffer 412 (FIG. 4) may be implemented as an analog/digital buffer with the function selected by one or more bits of the address information.

The address information can also be decoded to generate data select signals 521 and 523 to select particular nodes within the digital blocks. The data select signal 521 selects node 525 in block 1 by turning on tristate buffer 522 and selects node 529 in block 2 by turning on tristate buffer 524. The data select signal 523 selects node 527 in block 1 by turning on tristate buffer 528 and selects node 531 in block 2 by turning on tristate buffer 532. Output buffer 512 receives the outputs of tristate buffers 509 and 511, only one of which is active at a time.

Figure 6:
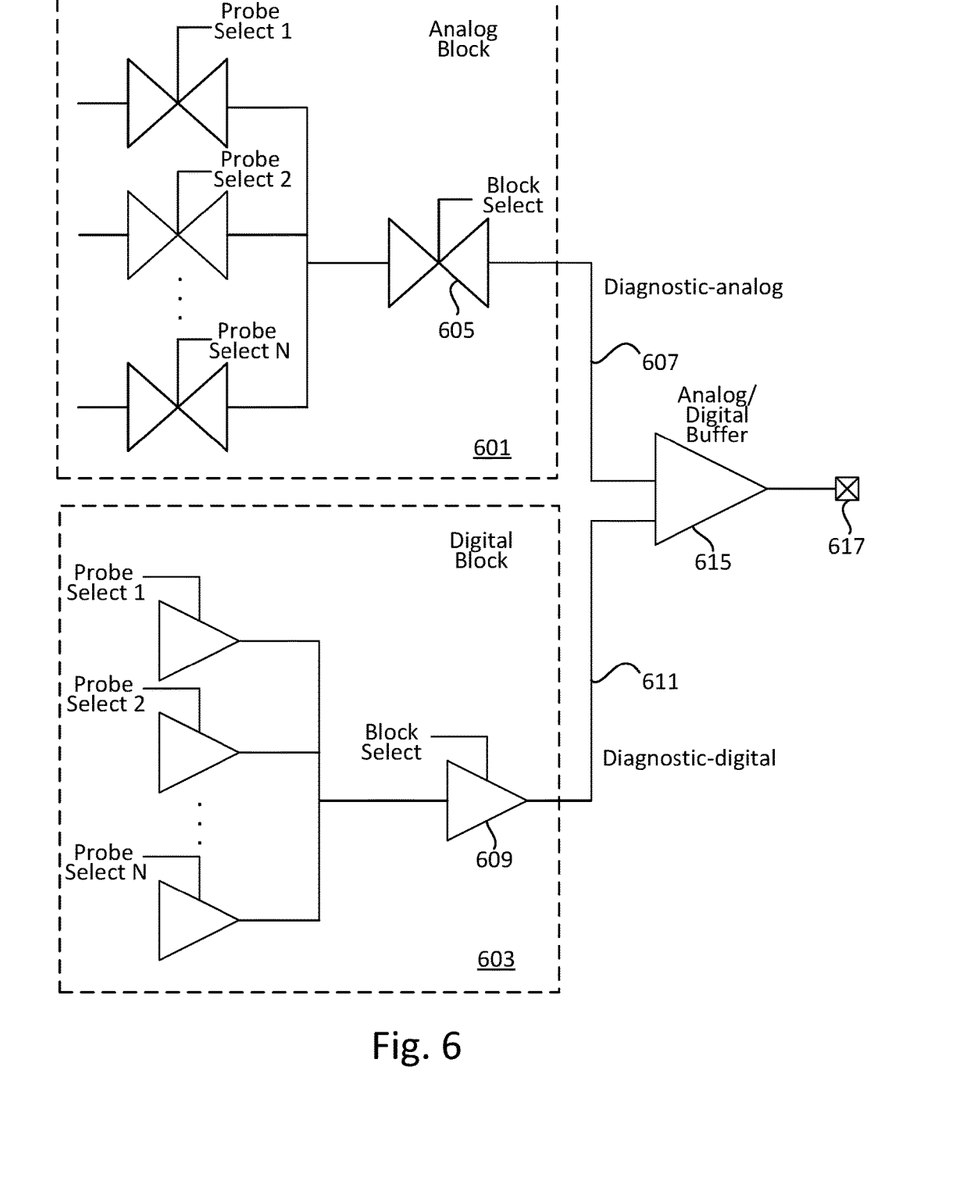
FIG. 6 illustrates an analog block and digital block receiving probe select and block select signals.

FIG. 6 illustrates analog block 601 and digital block 603 receiving probe select and block select signals. The output of the analog block select logic 605, which is equivalent to transistors 409 and 411 in FIG. 4, drives the analog diagnostic bus 607 and the output of the digital block select logic 609, which is equivalent to tristate buffers 509 and 511 in FIG. 5, drives the digital block select bus 611. The analog/digital buffer 615 receives inputs from the analog and digital diagnostic buses and drives a die output pad 617. One or more bits of the serial diagnostic information may select operation of the buffer 615 to select driving either the analog diagnostic bus or the digital diagnostic bus to output pad 617.

Figure 7:
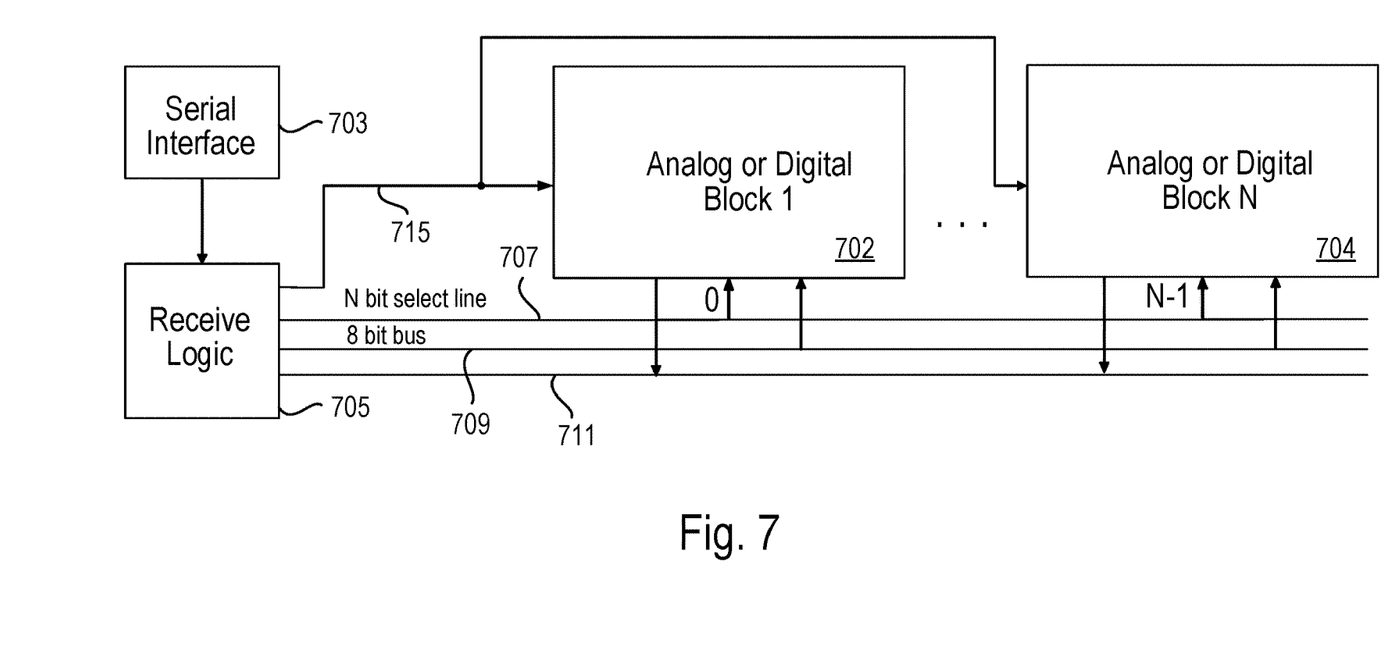
FIG. 7 illustrates distribution of the block select lines and the node select lines in an embodiment.

FIG. 7 shows an embodiment illustrating distribution of the block select lines and the node select lines to the blocks in either the transmit die or the received die. FIG. 7 shows the serial interface 703 (shown also as serial I/F 205 and 305) supplies a receive logic block 705 with the serial data received over the isolation channel (or from an input pin on the transmit die). While the serial interface 703 and receive logic 705 are shown separately for illustration purposes, they may be combined as a single logic block. The receive logic decodes the received diagnostic information into appropriate address information and data to select a node to observe. The receive logic supplies an N bit select line 707 with one bit being supplied to each of the N blocks including blocks 702 and 704. In addition, the receive logic supplies each block with an 8-bit parallel data select line 709 allowing for up to 8 nodes to be selected within each block. This bus could also be decoded to provide even more select lines within the block. The data line, only one of which is asserted at a time, selects a probe switch or tristate buffer within the selected block. The selected node and block drive the data onto the diagnostic bus 711, which includes separate analog and digital signal lines, and which is supplied to the high impedance output buffer (not shown in FIG. 7), which drives the output pad on the die.

The receive logic 705 may also be used to configure the analog or digital blocks for testing. For example, the serial diagnostic data received from the serial interface may be configuration data to configure an aspect of one of the blocks. The receive logic decodes the diagnostic information to identify the information as configuration data and the destination for the configuration data. The configuration data may be supplied to blocks 702 and 704 over a configuration data bus 715 to set, e.g., a voltage, current bias, clock frequency or other analog or digital setting in one of the blocks. That configuration setting is static and once set, nodes within the configured block or other blocks may be observed using the N-bit select line 707 and the 8-bit data line 709, and the diagnostic bus 711. As explained further herein, the receive logic may also provide enable/disable logic for the diagnostic capability of the transmit and receive dies.

In one or more embodiments, the serial interfaces in both the transmit and receive dies are active only during diagnostic/debug activity. In a pin limited environment, such as found in many isolation products, operating in a distinct diagnostic mode allows operational terminals, e.g., the enable input terminal on the transmit die to be used for diagnostic purposes.

In order to activate the diagnostic capability of the transmit die, the power supply (VDD) is held (externally to the part) at a first voltage level, e.g., 3V, that is lower than a second voltage level, e.g., 5V, while serial data is written to unlock the diagnostic capability. Once the power supply reaches the second voltage level, which may the voltage level for normal operation, the serial interface shuts down. Referring again to FIG. 2, a voltage level detect circuit 221 detects when the power supply is at the normal operational level. When the full operational level is detected, a disable signal 223 disables the serial interface 205 by, e.g., switching off the power supplied to all or a portion of the serial interface logic 205. Alternatively, the disable signal may be used to control a state machine or other control logic in the serial interface or receive logic 705 (see FIG. 7) to prevent input data received from being used for diagnostic purposes. For example, all the block select and data select signals may be held inactive along with any configuration settings in a disabled state. The level detect circuit may be implemented using a stable voltage reference and a comparator that allows the disable signal to assert only when VDD reaches a normal operational level.

Figure 8A:
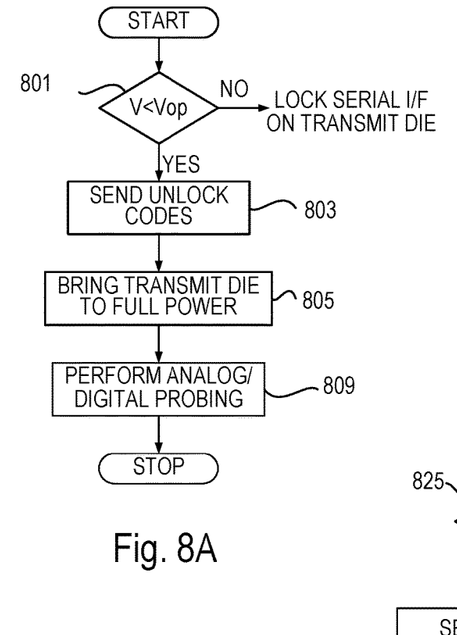
FIG. 8A illustrates an exemplary sequence for probing the transmit die.

FIG. 8A illustrates an exemplary sequence for probing the transmit die. Note that the receive die can be at full power during this sequence thereby preventing unlocking both the transmit and receive die. In 801 the voltage level detect circuit detects if the voltage (V) being supplied is less than a voltage level $V_{op}$, where $V_{op}$ is the voltage level for normal operation. If the voltage supply has reached a predetermined voltage level such as an operational voltage level, the diagnostic capability is disabled as described above. In 803, writing unlock codes (one or more specific values) contained in the serial diagnostic information to the transmit die while the power supply is held at a voltage lower than operational voltage, enables the diagnostic capability of the die. Thus, for example, the address portion of the serial diagnostic information may specify the unlock addresses, and the data portion of the serial diagnostic information may contain a specific value or values needed to unlock the diagnostic mode. The unlock code(s) may have to be written in a particular sequence. The transmit die can then be brought to full power in 805. At this point, the receive die can optionally have its voltage supply turned completely on in 807 and the diagnostic capability in the receive die will be disabled. Test probing of the transmit die can begin by writing diagnostic data having address and data information identifying a desired block and node to probe in the transmit die in 809. The test mode continues in 809 until probing is done. The testing may include utilization of configuration data in the transmit die sent to the serial interface in serial diagnostic data. At that point, the test mode can be turned off by turning the power off to the transmit die and then powering up to a full operational voltage level without sending unlock codes. Alternatively, or in addition, the test mode can be turned off by writing a lock code to one or more specific lock addresses in the transmit die. The lock codes may be specific data to specific addresses in a particular sequence. The address(es) may be the same as used to unlock the transmit die but with different data.

The serial interface and diagnostic capabilities of the receive side die and the transmit die default to being locked or disabled on power up. In order to turn on the diagnostic capabilities of the receive side die, the power supply of the receive die is held at a voltage level that is lower than a predetermined voltage level, e.g., a power supply voltage value for normal operation, and unlock codes are written to the receive die over the isolation channel. Referring again to FIG. 3, a voltage level detect circuit 321 detects when the power supply is at the predetermined voltage level, e.g., the normal operational voltage level. When voltage level detect circuit 321 detects the predetermined voltage level, a disable signal 323 disables the serial interface 305 by, e.g., switching off the power supplied to all or a portion of the serial interface 305. Alternatively, the disable signal may be used to control a state machine or other control logic in the serial interface or receive logic 705 (see FIG. 7) to prevent data received from an input terminal being used for diagnostic purposes. For example, all the block select and data select signals may be held inactive along with any configuration settings to disabler the diagnostic capability. The level detect circuit may be implemented using a stable voltage reference and a comparator that allows the disable signal to assert only when VDD reaches a normal operational level.

Figure 8B:
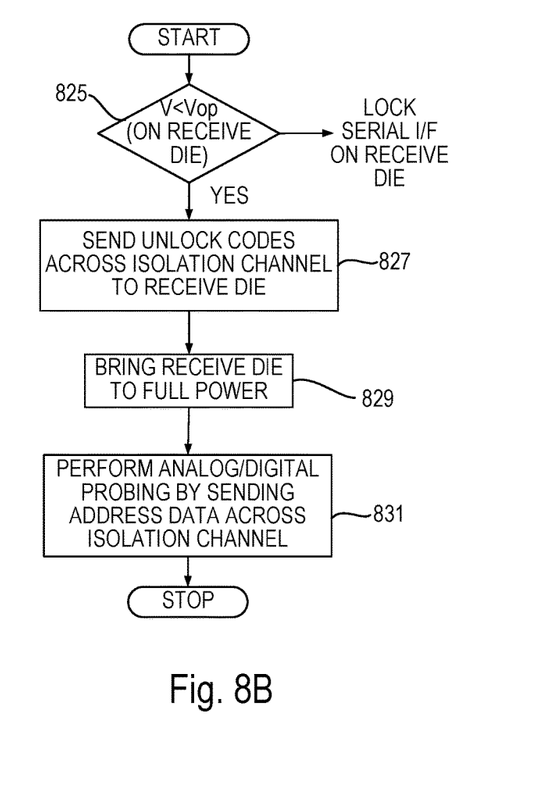
FIG. 8B illustrates an exemplary sequence for probing the receive die.

FIG. 8B illustrates an exemplary sequence for probing the receive die. During this sequence, the transmit die is maintained at full voltage to ensure transmissions across the isolation channel occur at full power. In 825, the voltage level detect circuit on the receive die determines if the voltage being supplied to the die is less than a predetermined voltage level, e.g., a normal operational voltage level. If the voltage reaches normal operational level before being unlocked, the diagnostic capability on the receive side die is disabled. To enable the diagnostic capability, while the voltage on the receive die is less than the predetermined voltage, diagnostic data is written to the transmit die and the transmit die sends the diagnostic data to the receive die in 827. The diagnostic data contains the unlock address(es) and data for the receive die and unlocks the diagnostic capability of the receive die. The unlock code(s) may be specific data written to specific address(es) in the serial port in the receive die. Once the receive die diagnostic capability is unlocked, the supply voltage can be increased in the receive die in 829 and test probing can begin by writing across the isolation channel diagnostic data identifying a desired block and node to probe in the receive die in 831. In addition, configuration data can be sent to the receive die and utilized in the receive die during testing. Once testing is completed, the test mode can be turned off by turning the power off to the receive die and powering up to a full operational voltage level. Alternatively, or in addition, the test mode can be turned off by writing a lock code to one or more specific lock addresses in the receive die. The lock codes may be specific data to specific addresses in a particular sequence. The address(es) may be the same as used to unlock the receive die but with different data.

Because the die can only enter test mode when the voltage supply is less than a normal operational voltage, the die will not inadvertently enter the test mode when used operationally at normal operational voltage.

Figure 9:
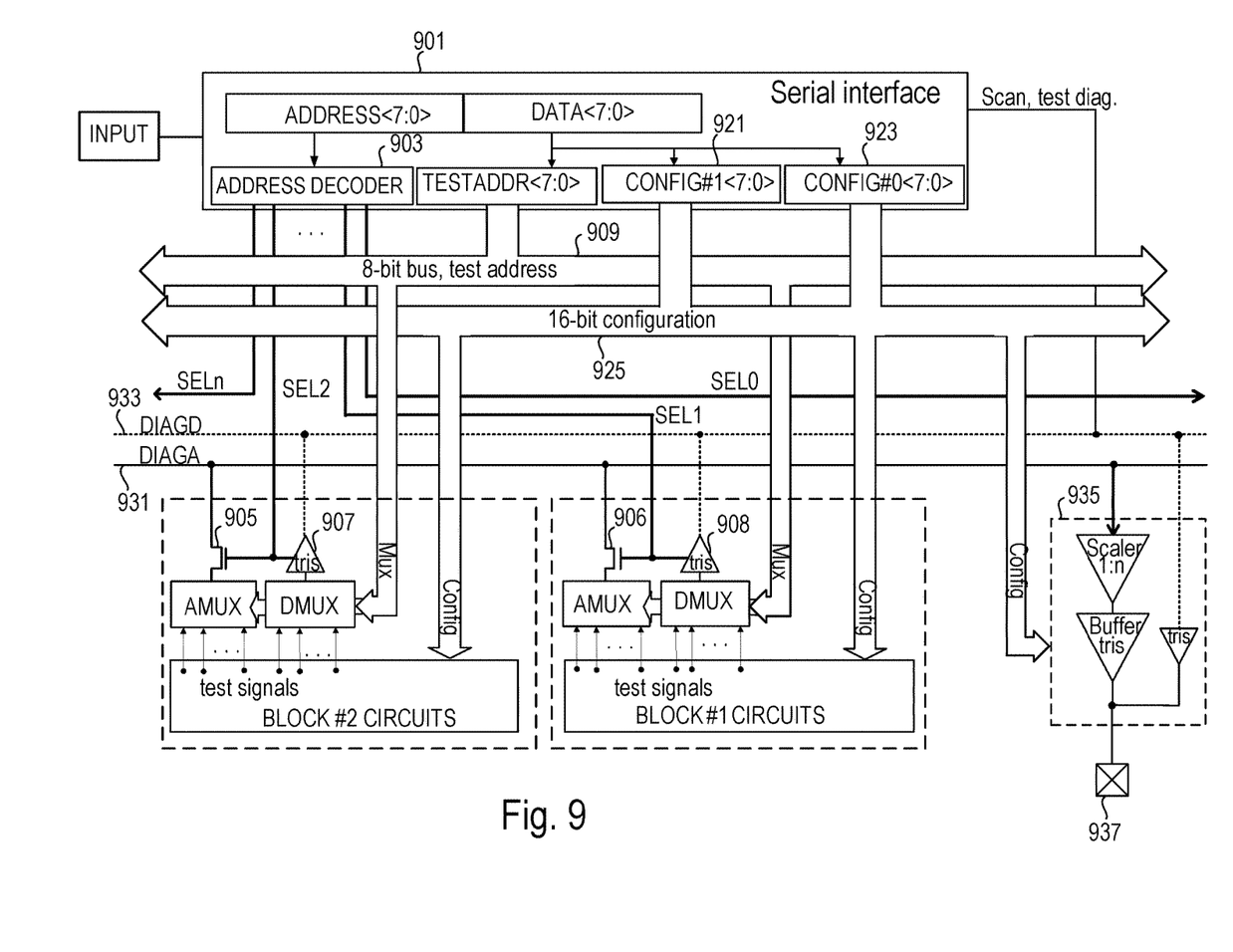
FIG. 9 illustrates the diagnostic architecture of the transmit or receive die according to an embodiment.

FIG. 9 illustrates another view of a block diagram of the diagnostic architecture in the transmit or receive die that allows testing, debug, and evaluation without decapping the part to probe nodes. Serial interface 901 receives serial diagnostic data. In the embodiment of FIG. 9, the serial interface also performs decode and configuration storage functions. The serial I/F 901 decodes the address portion of the diagnostic information using address decoder 903 and generates the select signals (SEL0, SEL1, and SELN) that function as block selects. For example, SEL2 enables transistor 905 and tristate buffer 907 and functions as a block select for block #2. SEL1 enables transistor 906 and tristate buffer 908 and functions as a block select for block #1. The serial interface also supplies an 8-bit data bus 909 to select internal nodes within each of the blocks. Analog select logic (AMUX) and digital select logic (DMUX) within each of the blocks may be implemented as shown, e.g., in FIGS. 4 and 5 using the data select lines to select the internal nodes in the block.

The serial I/F 901 also stores configuration data in configuration registers 921 and 923. In an embodiment, unique addresses decoded by address decoder 903 identify the configuration registers and the data (DATA<7:0>) associated with those addresses are loaded into the configuration registers. The configuration registers may be used to configure analog or digital aspects of the blocks using configuration bus 925. The block select devices 905 and 906 drive analog diagnostic bus 931. The block select devices 907 and 908 drive the digital diagnostic bus 933. Both buses 931 and 933 are supplied to buffer logic 935 that drives the output pad 937. One or more bits of the configuration bus 925 may be used to configure output buffer logic 935, e.g., by selecting the analog path or the digital path.

Thus, various aspects have been described relating to probing dies in an isolation system. The description of the invention set forth herein is illustrative, and is not intended to limit the scope of the invention as set forth in the following claims. Other variations and modifications of the embodiments disclosed herein, may be made based on the description set forth herein, without departing from the scope of the invention as set forth in the following claims.

What is claimed is:

1. A method comprising:
  receiving first diagnostic data at a transmit die;
  transmitting the first diagnostic data over an isolation channel to a receive die;
  receiving the first diagnostic data at the receive die;
  supplying a signal from an internal node in the receive die to an output terminal of the receive die, the internal node in the receive die identified by the first diagnostic data;
  selecting one of a first plurality of blocks in the receive die based on a block select portion of the first diagnostic data; and
  selecting one of a first plurality of nodes within the one of the first plurality of blocks as the internal node.

2. The method as recited in claim 1 wherein the transmit die and receive die are disposed in a package.

3. The method as recited in claim 1, further comprising supplying one of an analog signal and a digital signal from the one of the first plurality of nodes.

4. The method as recited in claim 1, further comprising:
  receiving second diagnostic data at the transmit die; and
  supplying a second signal from an internal node in the transmit die to an output terminal of the transmit die, the internal node in the transmit die identified by the second diagnostic data.

5. The method as recited in claim 4, further comprising:
  selecting one of a second plurality of blocks in the transmit die with a block select portion of the second diagnostic data; and
  selecting one of a second plurality of nodes within the one of the second plurality of blocks as the internal node in the transmit die.

6. The method as recited in claim 1, further comprising:
  receiving second data at the transmit die;
  sending the second data from the transmit die to the receive die over the isolation channel;

configuring a first analog block in the receive die based on the second data;
receiving third data at the transmit die;
sending the third data to the receive die; and
supplying a second signal from a second internal node in the receive die to the output terminal of the receive die while the first analog block remains configured according to the second data, the second internal node in the receive die identified by the third data.

7. A method comprising:
receiving first diagnostic data at a transmit die;
transmitting the first diagnostic data over an isolation channel to a receive die;
receiving the first diagnostic data at the receive die;
supplying a signal from an internal node in the receive die to an output terminal of the receive die, the internal node in the receive die identified by the first diagnostic data;
receiving second diagnostic data at the receive die from the transmit die prior to receiving the first diagnostic data while a voltage being supplied to the receive die is below a full operational voltage; and
unlocking a diagnostic mode in the receive die based on the second diagnostic data thereby allowing the first diagnostic data to cause the signal from the internal node in the receive die to be supplied to the output terminal of the receive die.

8. An apparatus:
a transmit die coupled to an isolation channel and configured to transmit first diagnostic data received over an isolation channel to a receive die;
receive logic in the receive die coupled to the isolation channel and configured to select an internal node in the receive die based on the first diagnostic data;
an output terminal on the receive die coupled to receive a signal from the internal node, the signal indicating a state of the internal node; and
wherein the first diagnostic data includes block select information to select one of a plurality of blocks within the receive die and the first diagnostic data includes node select information to select one of a plurality of nodes within the one of the plurality of blocks as the internal node.

9. The apparatus as recited in claim 8 wherein the transmit die and receive die are disposed in a package.

10. The apparatus as recited in claim 8, wherein the signal from the internal node is one of an analog signal and a digital signal.

11. The apparatus as recited in claim 8, further comprising:
second receive logic in the transmit die coupled to receive second data from an input terminal of the transmit die and configured to supply select signals to select a transmit die node; and
an output terminal in the transmit die coupled to the transmit die node to supply a second signal received therefrom.

12. The apparatus as recited in claim 8,
wherein the receive logic is further configured to configure a first analog block in the receive die according to second data received over the isolation channel and to select a second internal node in a second analog block of the receive die to be coupled to the output terminal of the receive die while the first analog block remains configured according to the second data, the second internal node in the receive die identified by third data received over the isolation channel.

13. The apparatus as recited in claim 12,
wherein at least one of a voltage or a current setting in the first analog block is configured based on the second data.

14. The apparatus as recited in claim 8, wherein the block select information provides block select signals and only one of the block select signals is in an asserted state at a time.

15. An apparatus comprising:
a transmit die coupled to an isolation channel and configured to transmit first diagnostic data received over an isolation channel to a receive die;
receive logic in the receive die coupled to the isolation channel and configured to select an internal node in the receive die based on the first diagnostic data; and
an output terminal on the receive die coupled to receive a signal from the internal node, the signal indicating a state of the internal node; and
wherein the receive logic is configured to require one or more second diagnostic data be written to one or more addresses in the receive logic to unlock diagnostic functionality of the receive die prior to the first diagnostic data being written to the receive die to probe the receive die, the second diagnostic data being written while voltage being supplied to the receive die is below an operational level.

16. An apparatus comprising:
an isolation channel;
a transmit die having an input terminal to receive first diagnostic data and configured to transmit the first diagnostic data over the isolation channel;
a receive die coupled to receive the first diagnostic data over the isolation channel, the first diagnostic data including one or more unlock codes for writing to one or more addresses in the receive die to enable receive die diagnostic capability if the one or more unlock codes are supplied while a receive die voltage supply is at a first voltage level and the receive die diagnostic capability is disabled if the receive die voltage supply reaches a second voltage level before the one or more unlock codes are supplied;
wherein the receive die is responsive to second diagnostic data received after the receive die diagnostic capability is enabled to select an internal node; and
wherein the receive die is responsive to the second diagnostic data to couple the internal node to an output terminal of the receive die if the receive die diagnostic capability is enabled.

17. The apparatus as recited in claim 16 further comprising:
a level detect circuit to detect a voltage level of the receive die voltage supply and to supply an indication of whether the receive die voltage supply is at the first voltage level or the second voltage level.

18. The apparatus as recited in claim 17 wherein the second voltage level is an operational voltage level for the receive die and is higher than the first voltage level.

* * * * *

UNITED STATES PATENT AND TRADEMARK OFFICE
CERTIFICATE OF CORRECTION

PATENT NO. : 10,488,456 B2  
APPLICATION NO. : 15/609996  
DATED : November 26, 2019  
INVENTOR(S) : Ernest T. Stroud et al.

Page 1 of 1

It is certified that error appears in the above-identified patent and that said Letters Patent is hereby corrected as shown below:

On the Title Page

(74) please replace "Zaborin" with --Zagorin--.

Signed and Sealed this  
Twenty-eighth Day of January, 2020

Andrei Iancu  
*Director of the United States Patent and Trademark Office*